(12) United States Patent
Abwa et al.

(10) Patent No.: US 7,906,961 B2
(45) Date of Patent: Mar. 15, 2011

(54) MAGNETIC FIELD SENSOR ARRANGEMENT AND METHOD FOR NON-CONTACT MEASUREMENT OF A MAGNETIC FIELD

(75) Inventors: Sari Abwa, Edelsgrub (AT); Manfred Brandl, Gratwein (AT); Josef Janisch, Ilz (AT)

(73) Assignee: austrianmicrosystems AG, Unterpremastätten (AT)

( * ) Notice: Subject to any disclaimer, the term of this patent is extended or adjusted under 35 U.S.C. 154(b) by 169 days.

(21) Appl. No.: 12/086,831

(22) PCT Filed: Dec. 19, 2006

(86) PCT No.: PCT/EP2006/012267
§ 371 (c)(1),
(2), (4) Date: Mar. 9, 2009

(87) PCT Pub. No.: WO2007/071383
PCT Pub. Date: Jun. 28, 2007

(65) Prior Publication Data
US 2009/0315547 A1    Dec. 24, 2009

(30) Foreign Application Priority Data

Dec. 19, 2005   (DE) .................. 10 2005 060 713

(51) Int. Cl.
G01R 33/07    (2006.01)
G01R 33/02    (2006.01)
(52) U.S. Cl. .................. 324/251; 324/207.2; 324/249
(58) Field of Classification Search ............... 324/207.2, 324/249, 251; 338/32 R, 32 H; 327/510–511
See application file for complete search history.

(56) References Cited

U.S. PATENT DOCUMENTS

| 5,146,201 | A  | 9/1992 | Kimura et al. |
| 5,525,901 | A  | 6/1996 | Clymer et al. |
| 5,896,030 | A  | 4/1999 | Hasken |
| 6,025,979 | A  | 2/2000 | Yamane et al. |
| 2005/0007694 | A1 | 1/2005 | Takahashi |

FOREIGN PATENT DOCUMENTS

| DE | 19744050 A1 | 4/1998 |
| DE | 19983808 T1 | 1/2002 |
| DE | 102004017119 A1 | 10/2005 |
| EP | 0544479 A2 | 6/1993 |
| EP | 0916074 B1 | 7/2003 |
| EP | 1363134 A2 | 11/2003 |
| EP | 1 382 935 | 1/2004 |
| EP | 1574870 A2 | 9/2005 |
| GB | 2 352 522 | 1/2001 |

OTHER PUBLICATIONS

Austriamicrosystems Preliminary Data Sheet, "AS5043 Programmable 360° Magnetic Angle Encoder with Absolute SSI and Analog Outputs", Rev. 1.6, Oct. 3, 2006 pp. 1-26.
Austriamicrosystems Data Sheet "AS5045 12 Bit Programmable Magnetic Rotary Encoder", Rev. 1.2, Oct. 3, 2006, pp. 1-23.

*Primary Examiner* — Bot L LeDynh
(74) *Attorney, Agent, or Firm* — Cohen Pontani Lieberman & Pavane LLP

(57) ABSTRACT

A magnetic field sensor arrangement (4) comprises a stacked arrangement (1) with a first magnetic field sensor body (20) and a second magnetic field sensor body (40). The first magnetic field sensor body (20) has a first main surface (21), on which is arranged a first magnetic field sensitive element (23), and a second main surface (22), which is approximately parallel to the first main surface (21). The second magnetic field sensor body (40) has similarly a first main surface (41), on which is arranged a second magnetic field sensitive element (43), and a second main surface (42), which is approximately parallel to the first main surface (41).

23 Claims, 6 Drawing Sheets

MAGNETIC FIELD SENSOR ARRANGEMENT AND METHOD FOR NON-CONTACT MEASUREMENT OF A MAGNETIC FIELD

RELATED APPLICATIONS

This is a U.S. national stage under 35 USC 371 of application Ser. No. PCT/EP2006/002267, filed on 19 Dec. 2006.

This application claims the priority of German application no. 10 2005 060 713.6 filed Dec. 19, 2005, the entire content of which is hereby incorporated by reference.

FIELD OF THE INVENTION

The present invention relates to a magnetic field sensor arrangement, a use of the magnetic field sensor arrangement, and a method for non-contact measurement of a magnetic field.

BACKGROUND OF THE INVENTION

Sensor arrangements for determining a magnetic field are used, among others, for ascertaining angle or length information. Exemplary applications in automotive engineering are an electronic determination of the e-gas pedal position, an electronic determination of the e-gas throttle feedback, an electronic steer-by-wire system, and an electronic determination of the gear stick position control. A very high degree of reliability is attained with these applications. A failure in such applications can have fatal results. In order to improve the reliability, two sensors can be placed alongside each other. In this case it can happen that a magnet cannot be located in the ideal position for both of the sensors, and the accuracy of the magnetic field determination is, therefore, reduced. The possible applications are limited due to the large space requirement.

SUMMARY OF THE INVENTION

One object of the present invention is to provide a magnetic field sensor arrangement and a method for the non-contact measurement of a magnetic field, with which the reliability and the accuracy are increased, where the magnetic field sensor arrangement is centered relative to a magnetic field, and which can be realized with a smaller space requirement.

This and other objects are attained in accordance with one aspect of the present invention directed to a magnetic field sensor arrangement that comprises a stacked arrangement. The stacked arrangement has a first magnetic field sensor body and a second magnetic field sensor body. The first magnetic field sensor body has a first main surface with a first magnetic field sensitive element, and a second main surface. The second main surface is approximately parallel to the first main surface. Accordingly, the second magnetic field sensor body has a first main surface with a second magnetic field sensitive element, and second main surface. The second main surface of the second magnetic field sensor body, too, is approximately parallel to the first main surface of the second magnetic field sensory body. Here, a stacked arrangement is understood to be the fact that the first magnetic field sensor body and the second magnetic field sensor body are arranged above one another in a direction of projection that is perpendicular to their first and second main surfaces.

A magnetic field thus acts on the first as well on the second magnetic field sensor body. As both magnetic field sensor bodies respectively have a magnetic field sensitive element, the magnetic field is determined redundantly.

Advantageously, the reliability is increased as compared to a single magnetic field sensitive element. It is an advantage of the arrangement of the magnetic field sensor bodies, that both magnetic field sensor bodies can be arranged such that they are centrally aligned with respect to a magnetic field.

In one embodiment, the first and/or the second magnetic field sensitive element can be built as a magnetic field sensitive field effect transistor.

In an alternative embodiment, the first and/or the second magnetic field sensitive element are built as a Hall structure. The first and/or the second magnetic field sensitive element can have a semiconductor, such as indium antimonide InSb, indium arsenide InAs, or gallium arsenide GaAs. Advantageously, the first and/or the second magnetic field sensitive element has silicon as a semiconductor material. It is an advantage of silicon that analog and digital circuitry can be realized for first and/or second magnetic field evaluation circuits for the evaluation of one or a plurality of signals of the first and/or second magnetic field sensitive element in one semiconductor body of silicon. Advantageously, Hall structures have a higher sensitivity than magnetically sensitive field effect transistors.

In an alternative embodiment, the first and/or second magnetic field sensitive element can be designed to use the magneto-resistive effect. For this, the first and/or the second magnetic field sensitive element can include binary and/or ternary alloys of nickel, iron, or cobalt. Preferably, the first and/or second magnetic field sensitive element can include permalloy. Permalloy can, for instance, be composed of 81% nickel and 19% iron.

In a further alternative embodiment, the first and/or second magnetic field sensitive element is built as a giant magneto-resistive structure or as a anisotropic magnetic resistor structure. For the determination of the magnetic field according to the giant magneto-resistive effect, the first and/or the second magnetic field sensitive element can comprise, for instance, multiple layers of iron and chromium, multiple layers of cobalt and copper, cobalt/copper films, or cobalt/silver films.

In a further development, the first magnetic field sensor body can comprise a first magnetic sensor array. A magnetic sensor array can also be designated as a multi-sensor arrangement of a plurality of magnetic field sensitive elements. The first magnetic sensor array can comprise the first magnetic field sensitive element and at least one further magnetic field sensitive element.

In a further development, the second magnetic field sensor body can comprise a second magnetic sensor array. The second magnetic sensor array can have the second magnetic field sensitive element and at least one further magnetic field sensitive element.

It is an advantage of magnetic sensor arrays that thereby the number of sensitive elements and with this, the number of output signals of the magnetic field sensor bodies, can be increased, and with that, the reliability with respect to a failure can be increased. It is an advantage of magnetic sensor arrays with magnetic field sensitive elements arranged in linear or polar configuration that with these arrays, information about angle, position, and length can be determined.

In one embodiment, the second main surface of the first magnetic field sensor body is facing the first main surface of the second magnetic field sensor body. In this embodiment, therefore, the first main surfaces of both magnetic field sensor bodies can be aligned in the direction of a magnetic field. Facing designates that the second main surface of the first magnetic field sensor body is arranged immediately upon the first main surface of the second magnetic field sensor body, or is distanced from it by one or a plurality of layers, or by one or a plurality of bodies. Main surfaces facing each other have surface-normal vectors that point into opposite directions.

In an alternative embodiment, the second main surface of the first magnetic field sensor body is facing the second main surface of the second magnetic field sensor body. Therefore, in this embodiment, the first main surfaces of the two magnetic field sensor bodies can be the surfaces on the outside of the stacked arrangement. In this embodiment the distance between the first main surfaces can be greater than in the preceding embodiment.

In a further alternative embodiment, the first main surface of the first magnetic field sensor body is facing the first main surface of the second magnetic field sensor body. In this embodiment, the two second main surfaces of the two magnetic field sensor bodies can form the outer surfaces of the stacked arrangement. The distance of the two first main surfaces is thereby smaller in this embodiment than in the two preceding embodiments. It is an advantage of this embodiment that the magnetic field sensitive elements on the first main surfaces as well as analog and digital circuitry of the magnetic field evaluation circuits for processing the output signals of the magnetic field sensitive elements are protected in that both first surfaces are inside main surfaces in the stacked arrangement.

In a further development, the stacked arrangement has a spacer that is arranged between the first magnetic field sensor body and the second magnetic field sensor body. The spacer can have a first and a second main surface which are approximately parallel to each other. The spacer can preferably include a material or a plurality of materials that have no significant influence on a magnetic field. Based on such a material selection, preferably, the magnetic field at the location of the first magnetic field sensitive element is approximately equal to the magnetic field at the location of the second magnetic field sensitive element.

The spacer can have a contour such that contact points on the first main surface of the first magnetic field sensor body and/or the first main surface of the second magnetic field sensor body are left open. It is an advantage of this embodiment that the connections to the contact points of one or both magnetic field sensor bodies can be arranged without interference by the spacer or the other magnetic field sensor body.

In one embodiment the spacer comprises a semiconductor body. In one embodiment, the semiconductor body can be produced from a thin wafer of a semiconductor material. It is an advantage of the production of the spacer from a wafer or a thinned wafer of a semiconductor material that the two main surfaces of the spacer are approximately parallel to each other, that the two main surfaces are very planar, and that impurities in the semiconductor material are very low. It is a further advantage that for the spacer, a semiconductor material can be selected that is the same as the material of the first and the second magnetic field sensor body, so that the thermal expansion coefficients of the distancing body and the two magnetic field sensor bodies are almost identical, and thereby the mechanical loading during temperature changes is kept low. Advantageously, the spacer includes silicon as material.

The first magnetic field sensor body can have a semiconductor body from a thinned wafer of a semiconductor material. Accordingly, the second magnetic field sensor body can have a semiconductor body of a thinned wafer of a semiconductor material. It is an advantage of using thinned wafers that the thickness of the stacked arrangement and the distances of the two magnetic field sensitive elements to a magnet can be adjusted, and small distances can be realized. In one embodiment, the first and the second magnetic field sensor body are thinned such that the first and the second magnetic field sensor body can be bent. For this, in one embodiment, a thickness of several 10s of micrometers to several 100s micrometers can be chosen for the first and the second magnetic field sensor body.

Advantageously, the first magnetic field sensor body and the second magnetic field sensor body are produced from the same semiconductor material. Advantageously, the two magnetic field sensor bodies include silicon as a material.

In a further development the stacked arrangement has a carrier body that is arranged between the first magnetic field sensor body and the second magnetic field sensor body.

In this embodiment the carrier body lies inside the stacked arrangement.

A carrier body can comprise conductors and connectors to feed a supply voltage to the first and/or second magnetic field sensor body as well as the electrical connection of the two magnetic field sensor bodies to each other, and lead off signals of the two magnetic field sensor bodies.

In an alternative embodiment the stacked arrangement comprises a carrier body that is arranged on an outer main surface of a stack of the first and the second magnetic field sensor body, or alternatively a stack of the first magnetic field sensor body, the spacer, and the second magnetic field sensor body. Thus, the carrier body can be arranged on the main surface of the second magnetic field sensor body that is further distanced from the first magnetic field sensor body. Alternatively, the carrier body can be arranged on the main surface of the first magnetic field sensor that is further distanced from the second magnetic field sensor body.

In a further development, the first magnetic field sensor body comprises a magnetic field evaluation circuit from which a first magnetic field sensitive signal can be accessed at the output side. The first magnetic field sensitive signal can be a first digitally coded signal. Alternatively, the first magnetic field sensitive signal can be a first analog signal. In a further alternative embodiment, the magnetic field evaluation circuit can be designed such that a first digitally coded signal and a first analog signal can be accessed at its output side. Accordingly, the second magnetic field sensor body can have a second magnetic field evaluation circuit from which a second magnetic field sensitive signal can be accessed at the output side. The second magnetic field sensitive signal can comprise a second digitally coded signal and/or a second analog signal. The first magnetic field sensitive signal can be made available depending on a signal of the first magnetic field sensitive element. Accordingly, the second magnetic field sensitive signal can be made available depending on a signal of the second magnetic field sensitive element.

In one embodiment, the first magnetic field evaluation circuit is arranged on the first main surface of the first magnetic field sensor body, and the second magnetic field evaluation circuit is arranged on the first main surface of the second magnetic field sensor body.

In one embodiment, the first magnetic field evaluation circuit can be coupled with the first magnetic field sensitive element, or alternatively with the first magnetic sensor array. Accordingly, the second magnetic field evaluation circuit can be coupled with the second magnetic field sensitive element, or alternatively with the second magnetic sensor array.

In a further embodiment of the first and/or second magnetic field sensor body, comprising the first and the second magnetic sensor array, respectively, the first or the second magnetic field evaluation circuit, respectively, can provide several analog signals and/or several digitally coded signals.

In one embodiment, the first magnetic sensor array and the first magnetic field evaluation circuit are monolithically integrated into the first magnetic field sensor body, as well as, the second magnetic sensor array and the second magnetic field evaluation circuit are monolithically integrated into the second magnetic field sensor body.

The first magnetic field sensor body and the second magnetic field sensor body can be designed such that each of the two magnetic field sensor bodies is sensitive with respect to essentially the same components of a common external magnetic field. For this, the two magnetic field sensor bodies can be realized such that each of the two magnetic field sensor bodies determines the direction of the common external magnetic field. Preferably, the two magnetic field sensor bodies can determine the direction of a common external magnetic field independently of each other. The first magnetic field sensor body and the second magnetic field sensor body can be designed as two independent sensors. The two magnetic field sensor bodies can be two angle sensors, or alternatively two position sensors, or alternatively two length sensors, or alternatively two distance sensors. This achieves the advantage of a high redundancy and reliability.

In one embodiment, a first diagnostic signal that depends on the operating state can be accessed at the output side of the first magnetic field evaluation circuit. Accordingly, a second diagnostic signal that depends on the operating state can be accessed at the output side of the second magnetic field evaluation circuit. The first and/or second diagnostic signal can comprise information such as, for instance, that the magnetic field is too weak for an evaluation, and/or a supply voltage has fallen below a threshold value, and/or that the magnet that creates the magnetic field performs a movement perpendicular to the first main surface of the first magnetic field sensor body. In the diagnostic signal information can be comprised that the magnetic field evaluation circuit has determined the failure of an array element through a comparison of signals from several array elements.

In a further development the magnetic field sensor arrangement has a further semiconductor body with a connecting circuit. The connecting circuit, on its input side is connected to at least one output of the first magnetic field evaluation circuit and to at least one output of the second magnetic field evaluation circuit. The connecting circuit can be provided to the signal(s) of the first magnetic field evaluation circuit and the second magnetic field evaluation circuit, to compare and to produce an output signal with an angle, length, distance, or alternatively position information with a very high reliability. The connecting circuit can be designed to also produce an output signal when of the four signals fed into the connecting circuit at the input side, three agree approximately, but the fourth differs.

The stacked arrangement can comprise the further semiconductor body with the connecting circuit. Alternatively, the further semiconductor body can be provided outside of the stacked arrangement.

In a further development, an output of the connecting circuit can be provided to produce a diagnostic signal of the magnetic field sensor arrangement.

In one embodiment, the first main surface of the first magnetic field sensor body and the first main surface of the second magnetic field sensor are approximately the same size.

In addition, the first main surface of the first magnetic field sensor body and the first main surface of the second magnetic field sensor body can have approximately equal geometric dimensions. Alternatively, the two magnetic field sensor bodies have different widths and lengths, whose product, again, is approximately equal.

In an alternative embodiment, the first main surface of the first magnetic field sensor body and the first main surface of the second magnetic field sensor body have different sizes. It is an advantage of this embodiment that due to the different sizes, recesses can be provided, which are provided for contacting of connection points of one of the first main surfaces.

In one embodiment, the magnetic field sensor arrangement can be arranged in a well known packaging arrangement, such as a shrink small outline package, or SSOP.

In an alternative embodiment, the magnetic field sensor arrangement can be housed in another well known packaging arrangement called a quad flatpack no-lead logic package, or QFN. It is an advantage of this housing form that it has very small outer dimensions, and due to its compact method of construction exhibits a high reliability.

The first and/or the second magnetic field sensor body can be produced by means of MOS or CMOS integration technology. Alternatively, it can be realized in a bipolar integration technology.

The magnetic field sensor arrangement can comprise a stacked arrangement with at least one further magnetic field sensor body. A further spacer can be provided in the stacked arrangement.

The carrier body can be build as a printed circuit board. Alternatively, the carrier body can be built as a flexible film. In an embodiment with a carrier body composed of a flexible film and a first and a second magnet field sensor body composed of a thinned semi-conductor material, a mechanically flexible stacked arrangement can be realized advantageously which enables an installation in a non-planar shape, for instance circular-shaped bent shapes.

The magnetic field sensor arrangement can be used for the non-contact measurement of the magnetic field of a rotating magnet for a determination of the angle of rotation. For this, an axis of rotation of the rotating magnet can be arranged centered above the first and the second magnetic sensor array. The magnetic field sensor arrangement can be used for non-contact measurement of a linearly moving magnet for ascertaining length, distance or position information. The magnetic field sensor arrangement can be used for determining the number of poles of a magnet wheel, which moves above the magnetic field sensor arrangement.

The magnetic field sensor arrangement can be applied to the non-contact measurement of the magnetic field of a current carrying conductor. In this use, the magnetic field sensor arrangement can be used for determining information about the strength and/or the frequency, and/or the phase of a current, which flows through an electrical conductor arranged above or in the magnetic field sensor arrangement.

According to the an aspect of the invention, a method for non-contact measuring of a magnetic field comprises the steps of:

The magnetic field is determined by means of a first magnetic field sensor body. A first magnetic field sensitive signal is provided by the first magnetic field sensor body at the output side.

The magnetic field is determined by means of a second magnetic field sensor body, which is arranged in a stacked arrangement on the first magnetic field sensor body. A second magnetic field dependent signal is provided by the second magnetic field sensor body at its output side.

Thus, advantageously, according to this method, a first and a second magnetic field dependent signal is provided. With this, the reliability is increased relative to an output of only one magnetic field sensitive signal.

Preferably, during the determination of the magnetic field by the first magnetic field sensor body, the magnetic field present at the location of the first magnetic field sensitive body is ascertained, and during the determination of the magnetic field by the second magnetic field sensor body, the magnetic field present at the location of the second magnetic field sensor body is ascertained.

In one embodiment, the magnetic field at the location of the first magnetic field sensor body can be approximately equal to the magnetic field at the location of the second magnetic field sensor body due to a small distance between the first magnetic field sensor body and the second magnetic field sensor body.

In summary, the invention has the following advantages:
It provides two magnetic field sensitive signals. Due to the higher information content in two signals compared to one signal, the reliability of the information and the accuracy of the magnetic field measurement and thus, the reliability is increased regarding a failure or a faulty determination.
Due to the stacked arrangement, the first and the second magnetic field sensor bodies are arranged above one another and can thus be simultaneously centered relative to the magnetic field of a magnet.
The space requirement of the stacked arrangement is small. The stacked arrangement shows a compact assembly, which enables an installation in applications with limited space available for a sensor.
Due to the compact assembly, the reliability of the magnetic field sensor arrangement is increased relative to a planar construction.

BRIEF DESCRIPTION OF THE DRAWINGS

Embodiments of the invention are described in connection with the following Figures. Bodies or components that are functionally or effectively equivalent have the same reference numbers. To the degree that arrangements, components, or circuit parts correspond in their function, their description is not repeated in each of the following Figures.

DETAILED DESCRIPTION OF THE DRAWINGS

Figure 1:
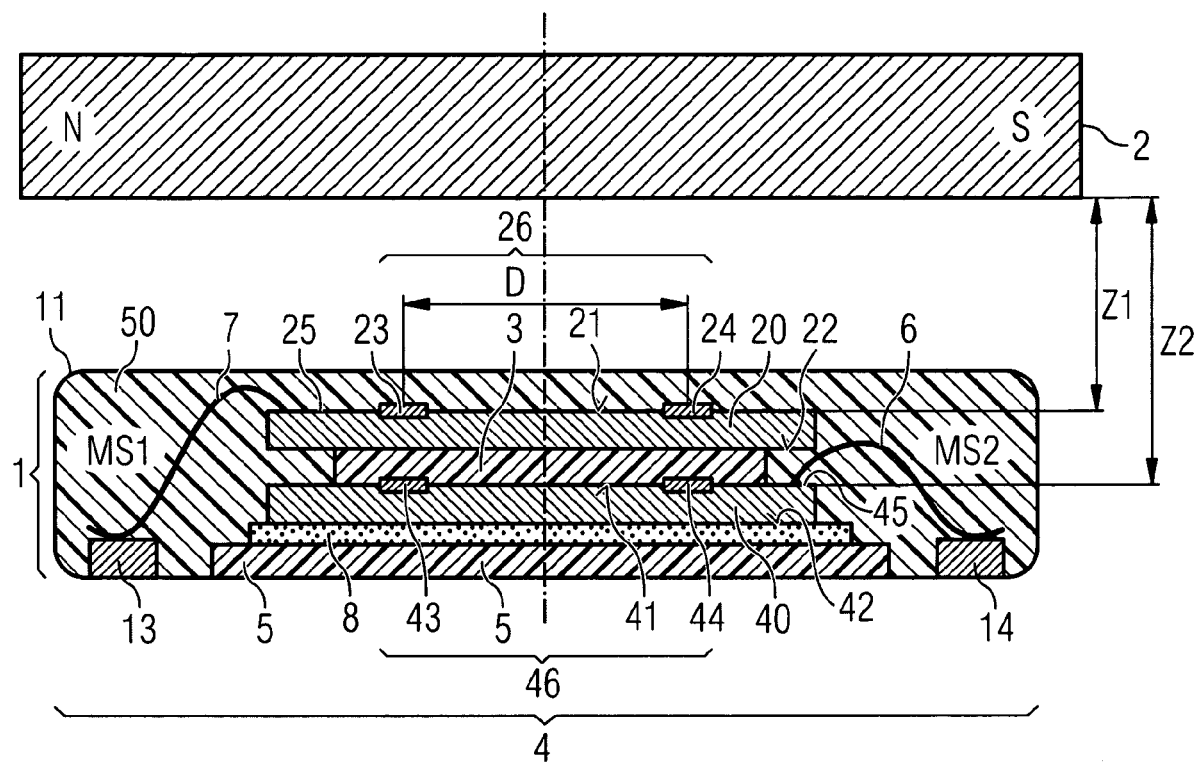
FIG. 1 shows an exemplary magnetic field sensor arrangement in cross section.

FIG. 1 shows an exemplary embodiment of a magnetic field sensor arrangement in cross section. The magnetic field sensor arrangement 4 comprises a stacked arrangement 1 with a first magnet field sensor body 20, a spacer 3, a second magnetic field sensor body 40 and a carrier body 5.

The first magnetic field sensor body 20 has on a first main surface 21, a first magnetic sensor array 26, comprising at least a first and a further magnetic field sensitive element 23, 24 and a first magnetic field evaluation circuit 25 coupled to the magnetic sensor array 26. A second main surface 22 of the first magnetic field sensor body 20 is parallel to the first main surface 21 of the first magnetic field sensor body 20. The second main surface 22 of the first magnetic field sensor body 20 is arranged on the spacer 3. The spacer 3 has two parallel main surfaces. The spacer 3 is arranged, in turn, on a first main surface 41 of the second magnetic field sensor body 40. Provided on the first main surface 41 of the second magnetic field sensor body 40 is a second magnetic sensor array 46 and a second magnetic field evaluation circuit 45, which is connected to the second magnetic sensor array 46. The second magnetic sensor array 46 comprises at least a second and a further magnetic sensitive element 43, 44. The second magnetic field sensor body 40 has a second main surface 42, which is parallel to the first main surface 41.

The second main surface 42 of the second magnetic field sensor body 40 is arranged on the carrier body 5. A connecting layer 8 is provided between the second main surface 42 of the second magnetic field sensor body 40 and the carrier body 5. The magnetic field sensor arrangement 4 has a bonding wire 7, which is provided for connecting the first evaluation circuit 25 to a connector 13. A bonding wire 6 is provided for connecting the second magnetic field evaluation circuit 45 and a connector 14.

The first magnetic field sensitive element 23 has a distance D to the further magnetic field sensitive element 24 of the first magnetic field sensor body 20. Likewise, the second magnetic field sensitive element 43 of the second magnetic field sensitive body 40 has a distance D from the further magnetic field sensitive element 44 of the second magnetic field sensitive body 40.

The first main surface 21 of the first magnetic field sensitive body 20 has a distance Z1 to a magnet 2. The first main surface 41 of the second magnetic field sensor body 40 has a distance Z2 to the magnet 2, the motion of which is being measured. In an exemplary embodiment, the two distances Z1, Z2 can be in a range from 0.5 mm to 2 mm.

The stacked arrangement 1 is housed using a quad flatpack no-lead logic package 11. The housing is composed of a polymer material 50. The polymer material 50 is, for example, a duroplast. Electrically conducting connectors 13, 14 serve for connecting the stacked arrangement 1 towards the outside.

The connectors 13, 14 have, for example, copper.

The magnet 2 acts on the magnetic field sensitive elements 23, 24 of the first magnetic field sensor body 20, as well as on the magnetic field sensitive elements 43, 44 of the second magnetic field sensor body 40. Signals, which can be accessed at the first and the second further magnetic field sensitive element 23, 24 of the first magnetic field sensitive body, are evaluated by means of the first magnetic field evaluation circuit 25, and provided as a first magnetic field sensitive signal MS1 at the connector 13. Correspondingly, signals of the magnetic field sensitive elements 43, 44 of the second magnetic field sensor body 40 are processed by the second magnetic field evaluation circuit 45, and a second magnetic field sensitive signal MS2 can be accessed at the connector 14.

Advantageously due to the two magnetic field sensitive bodies 20, 40, and respectively two magnetic field sensitive elements 23, 24, 43, 44, a determination of the magnetic field is enabled with a high degree of reliability regarding breakdowns. Thus, advantageously, a very compact stacked arrangement 1 for determining magnetic fields is realized in a space-saving housing 11. An advantage of the spacer 3 is that it increases the distance of the first magnetic field sensor body to the second magnetic field sensor body 40 such that the bonding wire 6 can be led out laterally.

FIGS. 2A to 2D show in cross sections, exemplary stacked arrangements with a first and a second magnetic field sensor arrangement 20, 40.

Figure 2A:
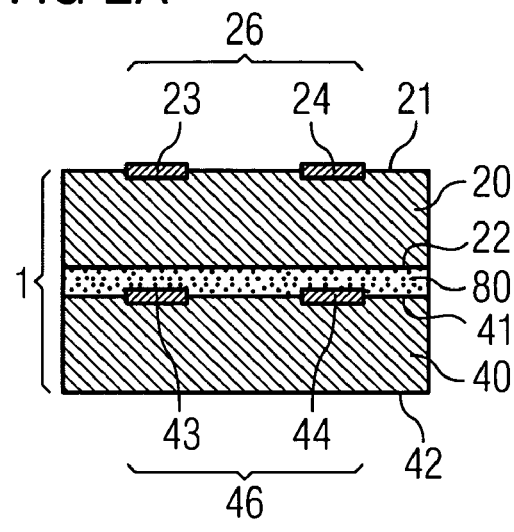
FIGS. 2A to 2D show cross sections of exemplary magnetic field sensor arrangements with a first and a second magnet field sensor body.

FIG. 2A shows a stacked arrangement 1 with a first and a second magnetic field sensor body 20, 40. The first magnetic field sensor body 20 has a first main surface 21, on which is arranged a first magnetic field sensitive element 23 and a further magnetic field sensitive element 24, and a second main surface 22. A first magnetic sensor array 26 comprises the first and the further magnetic field sensitive element 23, 24. Correspondingly, the second magnetic field sensor body 40 has a first main surface 41, on which is provided a second magnetic field sensitive element 43 and a further magnetic field sensitive element 44, and a second main surface 42. A second magnetic sensor array 46 comprises the second magnetic field sensitive element 43 and the further magnetic field sensitive element 44.

The first main surface 21 of the first magnetic field sensor body 20 is approximately parallel to the second main surface 22 of the same. The first main surface 41 of the second magnetic field sensor body 40 is approximately parallel to the second main surface 42 of the same.

According to FIG. 2A, the second main surface 22 of the first magnetic field sensor body 20 is arranged on the first main surface 41 of the second magnetic field sensor body 40.

An intermediate layer 80 is provided between the two magnetic field sensor bodies 20, 40.

Figure 2B:
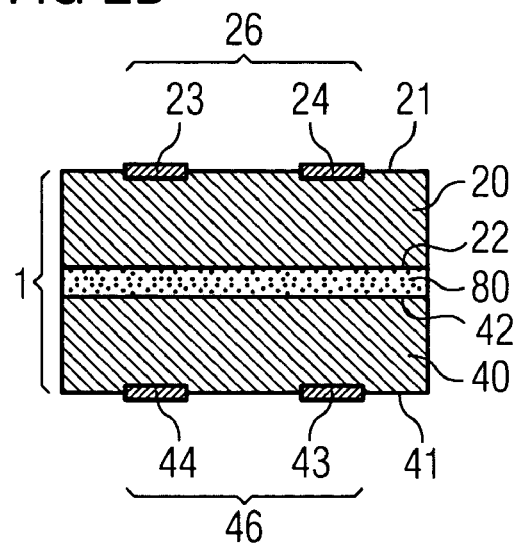

FIG. 2B shows an alternative stacked arrangement 1 to the stacked arrangement according to FIG. 2A. According to FIG. 2B, the second main surface 22 of the first magnetic field sensor body 20 is arranged on the second main surface 42 of the second magnetic field sensor 40. Thus, the magnetic field sensitive elements 23, 24, 43, 44 are located on the outer main surfaces of the stacked arrangement 1.

Figure 2C:
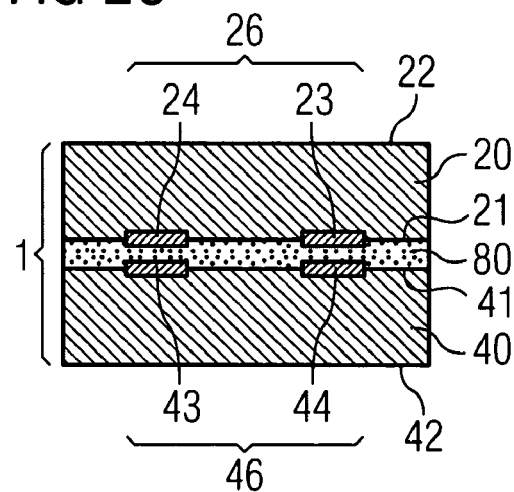

FIG. 2C shows a further alternative stacked arrangement 1 to the stacked arrangements according to FIGS. 2A and 2B. According to FIG. 2C, the first main surface 21 of the first magnetic field sensor body 20 is arranged on the first main surface 41 of the second magnetic field sensor body 40. The intermediate layer 80 serves for attaching the two magnetic field sensor bodies 40 to each other. According to FIG. 2C, the four magnetic field sensitive elements 23, 24, 43, 44 are attached at inner lying surfaces of the stacked arrangement 1 and not to one of the outer surfaces of the stacked arrangement 1. Thus advantageously, the magnetic field sensitive elements 23, 24, 43, 44 are protected from external mechanical effects.

Figure 2D:
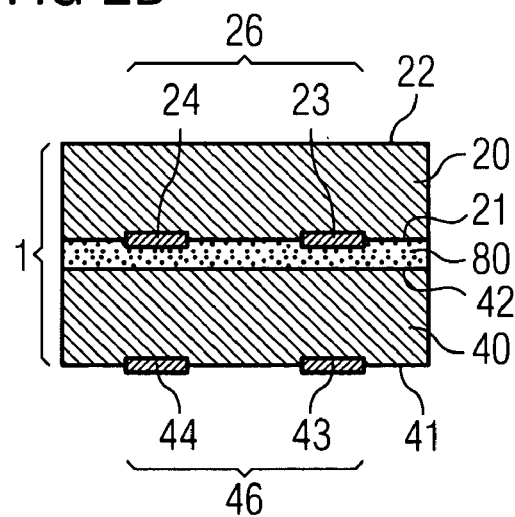

FIG. 2D shows a further alternative stacked arrangement 1 to the stacked arrangements according to FIGS. 2A to 2C. Here, the first main surface 21 of the first magnetic field sensor body 20 is arranged on the second main surface 42 of the second magnetic field sensor body 40. With an assembly on a carrier body 5, not shown, the four magnetic field sensitive elements 23, 24, 43, 44 are advantageously protected.

In alternative embodiments of the FIGS. 2A to 2D, a first magnetic field evaluation circuit 25, not shown, is arranged on the first main surface 21 of the first magnetic field sensor body 20, and a second magnetic field evaluation circuit 45, not shown, is arranged on the first main surface 41 of the second magnetic field sensor body 40.

In alternative embodiments of the FIGS. 2A to 2D, a carrier body 5, not shown, can be provided on one of the outer main surfaces of the stack, composed of the first and the second magnetic field sensor body 20, 40, or between the first magnetic field sensor body 20 and the second magnetic field sensor body 40.

FIGS. 3A to 3D show cross sections of exemplary magnetic field sensor arrangements. The magnetic field sensor arrangements according to the FIGS. 3A to 3D are further developments of the magnetic field sensor arrangements according to the FIGS. 2A to 2D, and comprise a spacer 3 in addition to the magnetic field sensor arrangements according to FIGS. 2A to 2D. The spacer 3 is arranged between the first magnetic field sensor body 20 and the second magnetic field sensor body 40.

Figure 3A:
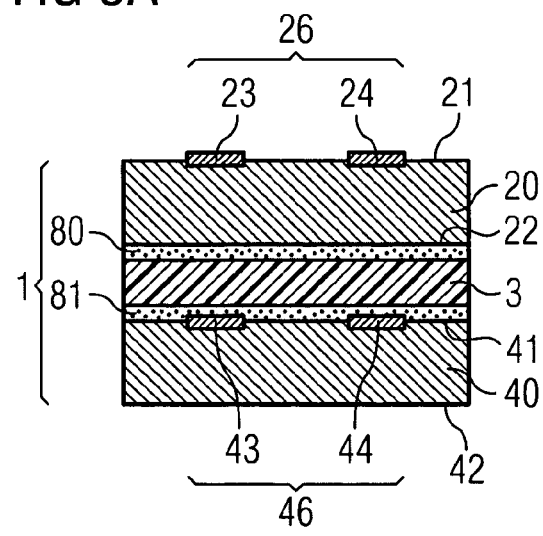
FIGS. 3A to 3D show cross sections of exemplary magnetic field sensor arrangements with a first magnet field sensor body, a spacer and a second magnetic field sensor body.

FIG. 3A shows a magnetic field sensor arrangement, which represents a further development of the magnetic field sensor arrangement according to FIG. 2A. The second main surface 22 of the first magnetic field sensor body 20 is arranged on a spacer 3, which in turn is arranged on the first main surface 41 of the second magnetic field sensor body 40. Two intermediate layers 80, 81 serve for attaching the three bodies 20, 3, 40 to each other.

Figure 3B:
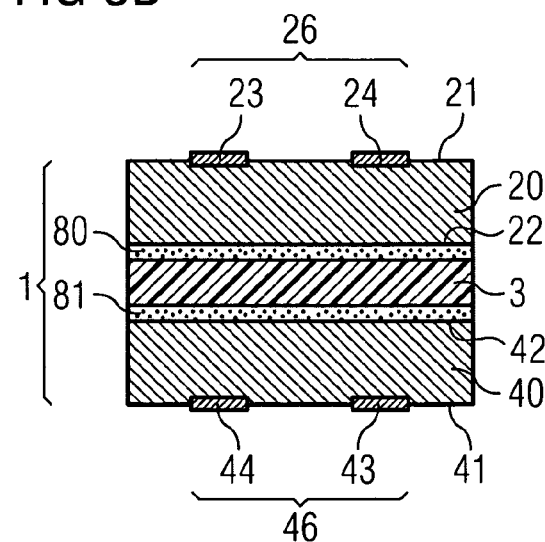

FIG. 3B shows a magnetic field sensor arrangement, which is a further development of the magnetic field sensor arrangement according to FIG. 2B. By means of the spacer 3, a larger distance is attained between the magnetic field sensitive elements 23, 24 of the first magnetic field sensor body 20 and the magnetic field sensitive elements 43, 44 of the second magnetic field sensor body 40.

Figure 3C:
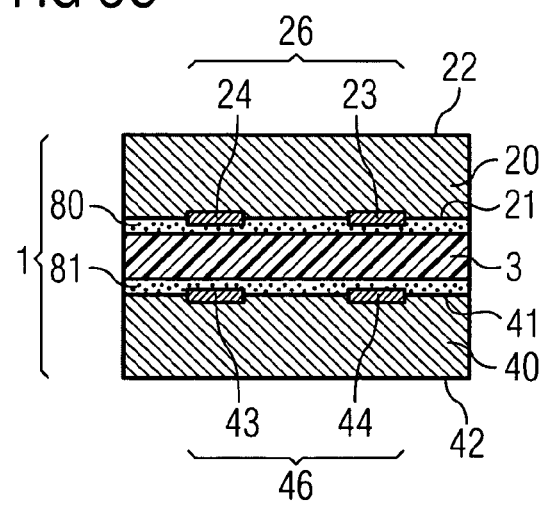

FIG. 3C shows a magnetic field sensor arrangement, which represents a further development of the magnetic field sensor arrangement according to FIG. 2C. By means of the spacer 3, a distance is attained between the magnetic field sensitive elements 23, 24 of the first magnetic field sensor body 20 and the magnetic field sensitive elements 43, 44 of the second magnetic field sensor body 40. Thus advantageously, the magnetic field sensitive elements 23, 24 43, 44 have a distance from each other, but continue to be arranged on inner lying surfaces of the stacked arrangement 1, and thus, are protected from external mechanical influences.

Figure 3D:
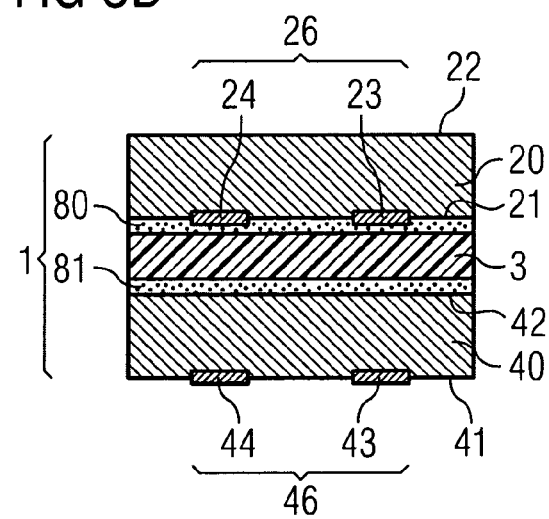

FIG. 3D shows a magnetic field sensor arrangement, which represents a further development of the magnetic field sensor arrangement according to FIG. 2D.

In alternative embodiments of the FIGS. 3A to 3D, a first magnetic field evaluation circuit 25, not shown, is arranged on the first main surface 21 of the first magnetic field sensor body 20, and a second magnetic field evaluation circuit 45, not shown, is arranged on the first main surface 41 of the second magnetic field sensor body 40.

In alternative embodiments of the FIGS. 3A to 3D, a carrier body 5, not shown here, can be provided on one of the outer main surfaces of the stack, composed of the first magnetic field sensor body 20, the spacer 3 and the second magnetic field sensor body 40, or between the first magnetic field sensor body 20 and the spacer 3, or alternatively, between the spacer 3 and the second magnetic field sensor body 40.

Figure 4A:
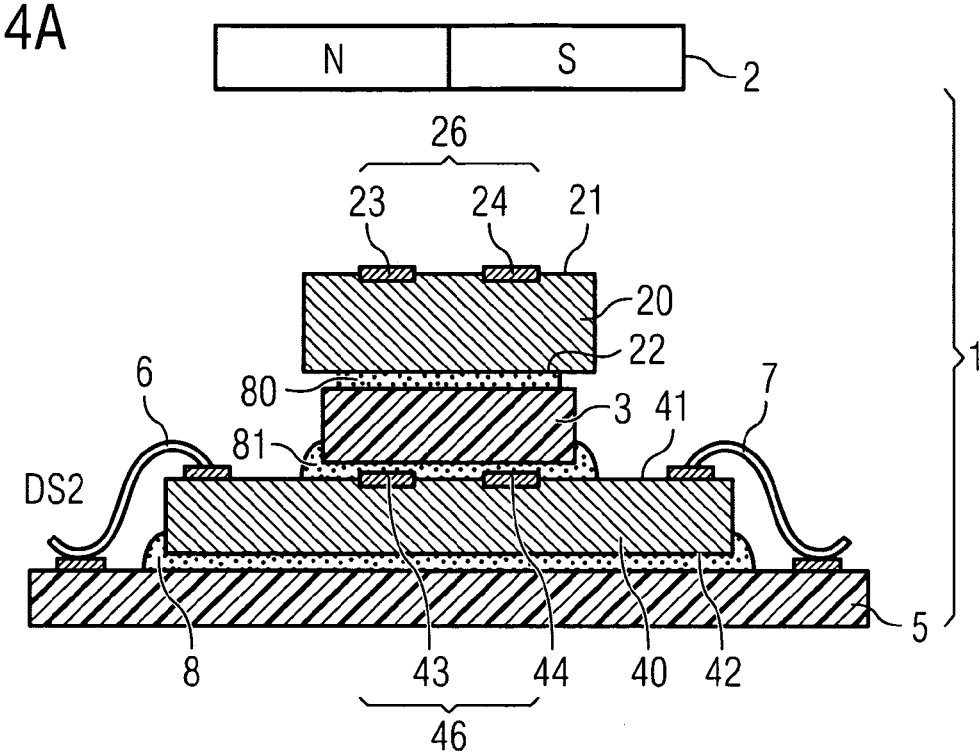
FIGS. 4A and 4B show an exemplary magnetic field sensor arrangement in a cross section and in a top view.
Figure 4B:
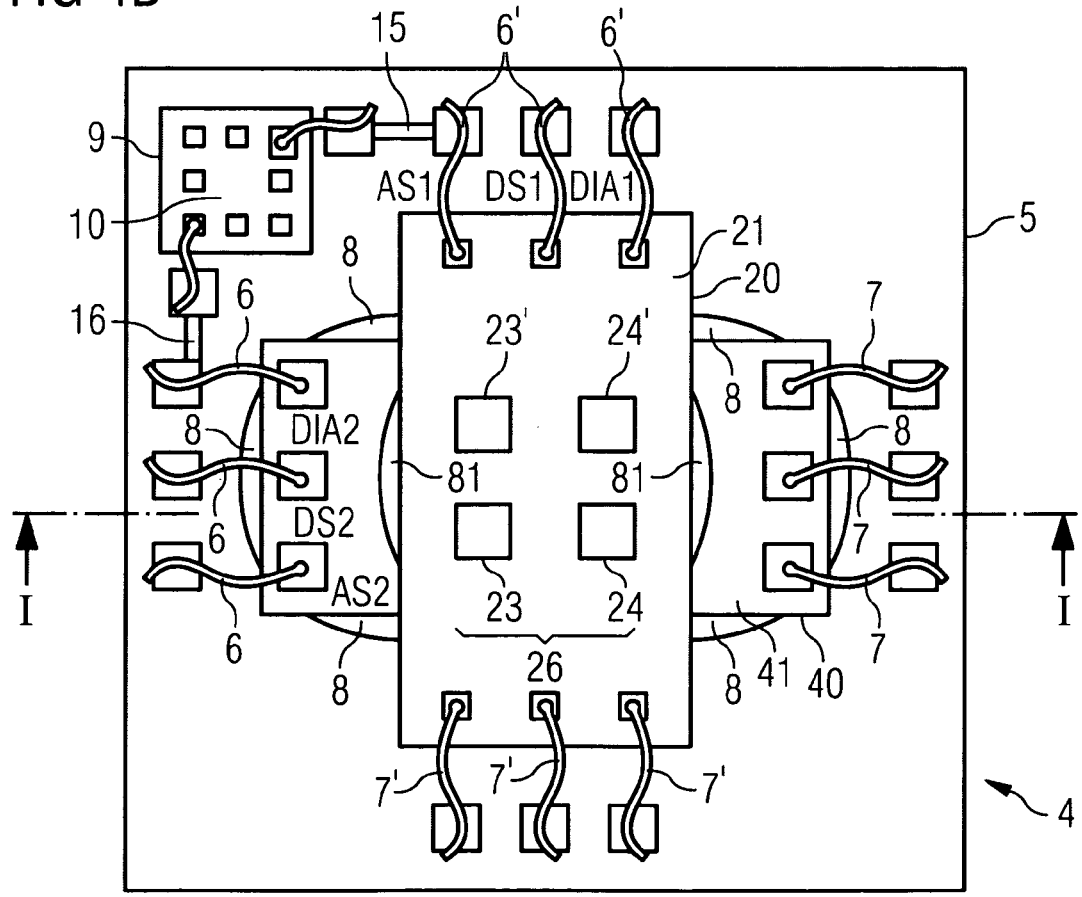

FIGS. 4A and 4B show a further exemplary magnetic field sensor arrangement.

FIG. 4A shows a cross section of the magnetic field sensor arrangement, which is a further development of the magnetic field sensor arrangement according to FIG. 1 and FIG. 3A. The stacked arrangement 1 according to FIG. 4A has a first magnetic field sensor body 20, which has a first main surface 21 with a first magnetic sensor array 26 and a second main surface 22, which is connected via an intermediate layer 80 to a spacer 3. The spacer 3 is arranged via a further intermediate layer 81 on a first main surface 41 of a second magnetic field sensor body 40. A second main surface 42 of the second magnetic field sensor body 40 is affixed on a carrier body 5 by means of a connecting layer 8. In FIG. 4A, the lateral dimensions are selected such that the first magnetic field sensor body 20 and the spacer 3 have a smaller lateral dimension in comparison to the second magnetic field sensor body 40. The carrier body 5 has a greater lateral dimension that the second magnetic field sensor body 40. Thus advantageously, bonding wires 6, 7 are provided for a connection of connectors on the first main surface 41 of the second magnetic field sensor body 40 to connectors on the carrier body 5.

FIG. 4B shows a top view of the magnetic field sensor arrangement according to FIG. 4A, in which a sectioning line I is given, at which the cross section shown in FIG. 4A is located. The first magnetic sensor array 26 comprises four magnetic field sensitive elements 23, 23', 24, 24' on the first main surface 21 of the first magnetic field sensor body 20. The first main surface 21 of the first magnetic field sensor body 20 is connected by means of six bonding wires 6', 7', to connectors on the carrier body 5. Multiple bonding wires 6' are provided for the further conducting of a first analog signal AS1, a first digital signal DS1, and a first diagnostic signal DIA1. The first magnetic field sensor body 20 is connected via the intermediate layer 80, the spacer 3, and the further intermediate layer 81, to the second magnetic field sensor body 40. Six bonding wires 6, 7 are shown, which connect connectors on the first main surface 41 of the second magnetic field sensor body 40 to six connectors of the carrier body 5. Multiple bonding wires 6 are provided for the further conducting of a second analog signal AS2, a second digital signal DS2, and a second diagnostic signal DIA2. The second magnetic sensor array 46 is not shown, because it is located beneath the first magnetic field sensor body 20.

The first magnetic field sensor body 20 and the second magnetic field sensor body 40 are built as rectangles and are arranged on top of each other such that the connectors on the first main surface 41 of the second magnetic field sensor 40 lie open and are not covered by the first magnetic field sensor body 20. Thus, this stacked arrangement enables a simple contacting by means of the bonding wires 6, 6', 7, 7'. The first magnetic field sensor body 20 can have the same construction as the second magnetic field sensor body 40. The magnetic field sensor arrangement according to FIG. 4B comprises further a semiconductor body 9 with a connecting circuit 10, which is arranged on the carrier body 5. The connecting circuit 10 is connected by means of bonding wires and connection lines 15, 16 to the two magnetic field sensor bodies 20, 40.

Thus advantageously, a magnetic field sensor arrangement 4 is provided having magnetic field sensitive elements that are arranged centered above one another.

The working principle of the magnetic field sensor is similar to the one described in EP 0916074 the content of which is hereby incorporated by reference.

The implementation of the evaluation circuits and the processing of sensor signals can be done as described in data sheets AS5043 and AS5045 from AUSTRIAMICROSYSTEMS, and the content of both of which is hereby incorporated by reference.

The output angle can be provided either as a digital or as an analog signal. The analog angle is deducted from the digital value using a digital/analog converter DAC. The above-mentioned data sheets include block diagrams which provide more details on the way the angle is determined based on the hall measurements. See, for example, FIG. 3 of the AS5043 Data Sheet.

The diagnosis signals DIA1 and DIA2 are mainly intended to indicate the distance between magnet and chip. They indicate whether the sensor is able to detect a valid magnetic field. In case the control which computes the rotational angle touches a limit, then an alarm signal may be generated.

In the computational algorithm for providing the angle, the SIN and COS signals are converted into an angle and an amplitude value (angle and norm of a vector). This amplitude value is compared to a reference, and a difference value is provided based on the comparison. This difference value is being accumulated. The accumulated value controls another DAC for the hall sensor current generation.

The diagnosis signals are accessible via a digital interface as well as through separate pins, depending on the application. In case of an analog output, the output level is forced into an error band in order to make any malfunction visible.

In alternative embodiments of FIGS. 4A and 4B, the first main surface 21 of the first magnetic field sensor body 20, comprises a first magnetic field evaluation circuit 25, not shown, which is switched between the first magnetic sensor array 26 and the bonding wires 6', 7'. Correspondingly, the first main surface 41 of the second magnetic field sensor body 40 comprises a second magnetic field evaluation circuit 45, not shown, which is switched between the second magnetic sensor array 46 and the bonding wires 6, 7.

Figure 5A:
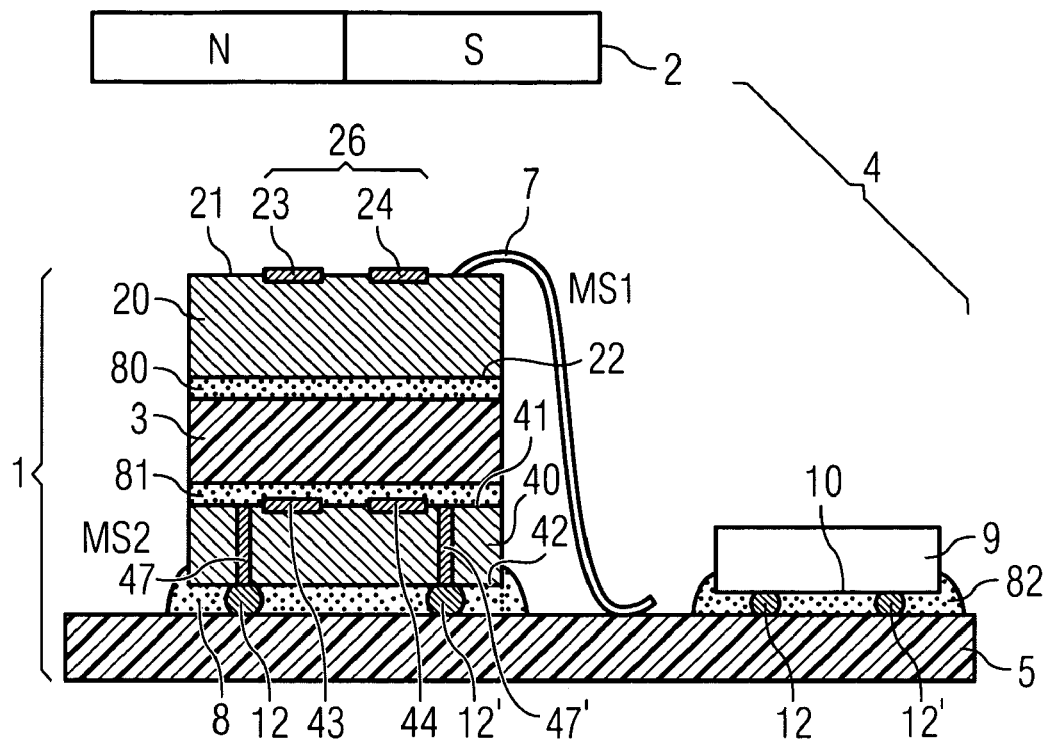
FIGS. 5A and 5B show further exemplary magnetic field sensor arrangements.

FIG. 5A show an exemplary magnetic field sensor arrangement in cross-section. It represents a further development of the magnetic field sensor arrangement according to the FIGS. 1, 3A, 4A and 4B. The second main surface 22 of the first magnetic field sensor body 20 is arranged, by means of the intermediate layer 80, on the spacer 3. The spacer 3 is connected, in turn, via the further intermediate layer 81 to the first main surface 41 of the second magnetic field sensor body 40. Conducting connections 47, 47' are provided for connecting the first main surface 41 to the second main surface 42 of the second magnetic field sensor body 40. The conducting connections 47, 47' are built as vias. Bumps 12, 12' are provided in order to connect the conducting connections 47, 47' electrically conducting to connectors, not shown, on the carrier body 5. The connecting layer 8 between the second main surface 42 of the second magnetic field sensor body 40 and the carrier body 5, is provided for mechanical attachment.

By means of bonding wire 7, the first main surface 21 of the first magnetic field sensor 20 is connected electrically conducting to a connector (not shown) on the carrier 5. A semiconductor body 9 with a connecting circuit 10 is located on the carrier body 5. The connecting circuit 10, likewise, is connected electrically conducting by means of bumps 12, 12' to connectors on the carrier body 5. A further connecting layer 82 between the semiconductor body 9 and the carrier body 5 serves for mechanical attachment. The two connecting layers 8, 82 can be designated as underfiller.

An advantage of the stacked arrangement 1 according to FIG. 5A is that, by means of conducting connections in 47, 47' within the second magnetic field sensor body 40, an electrical connection is enabled by the second main surface 42 of the second magnetic field sensor body 40. According to the magnetic field sensor arrangement 4 according to FIG. 5A, the first and the second magnetic field sensor bodies 20, 40, as well as the spacer 3, have the same lateral dimensions. The stack of the first magnetic field sensor body 20, the spacer 3, and the second magnetic field sensor body 40 can be produced advantageously as wafer composite. Only after the production as a wafer composite, the individual stacked arrangements 1 are produced from the three bodies 20, 3, 40 by means of sawing.

Thus, advantageously, individual steps for the chip-wise connection of different bodies can be reduced.

Figure 5B:
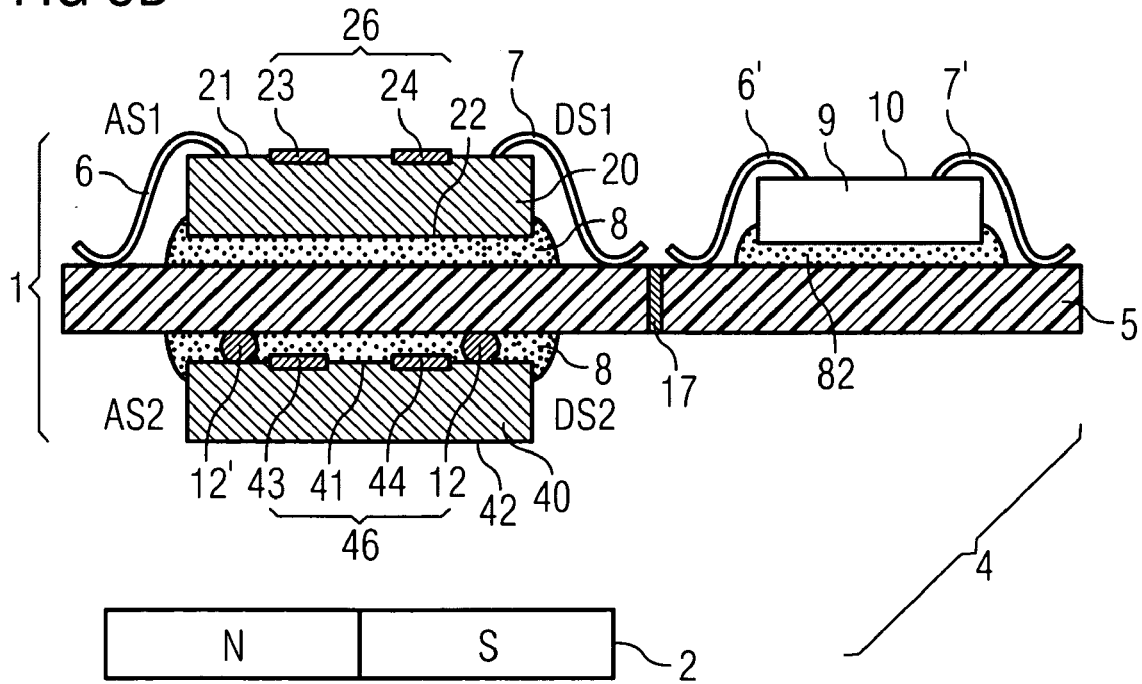

FIG. 5B shows a further exemplary magnetic field sensor arrangement in cross-section. This magnetic field sensor arrangement 4 is a further development of the magnetic field sensor arrangement according to FIG. 2A. The second main surface 22 of the first magnetic field sensor body 20 is connected, by means of a connecting layer 8, to the carrier body 5. The first main surface 41 of the second magnetic field sensor body 40 is connected by means of a further connecting layer 8 to a second main surface of the carrier body 5. Bonding wires 6, 7 are provided for the electrically conducting connection of the first main surface 21 of the first magnetic field sensor body 20 to connectors, not shown, of the first main surface of the carrier body 5.

Bumps 12, 12' are provided for realizing an electrically conducting connection from the first main surface 41 of the second magnet field sensor body 40 to connectors, not shown, on the second main surface of the carrier body 5. A semiconductor body 9 with a connecting circuit 10 is affixed similarly by means of a further connecting layer 82 on the first main surface of the carrier body 5. Bonding wires 6', 7' serve for connecting the connecting circuit 10 to connectors, not shown, on the first main surface of the carrier body 5. A via 17 is provided for connecting the first main surface to the second main surface of the carrier body 5. Further, FIG. 5B shows a magnet 2, which is arranged centered to the first magnetic sensor array and to the second magnetic sensor array 26, 46.

Thus, advantageously, a compact magnetic field sensor arrangement is provided which has four magnetic field sensitive elements 23, 24, 43, 44 and two magnetic field evaluation circuits 25, 45, as well as a connecting circuit 10. Due to the redundancies, an output signal can be advantageously delivered with a high reliability regarding malfunctions or failures.

Figure 6:
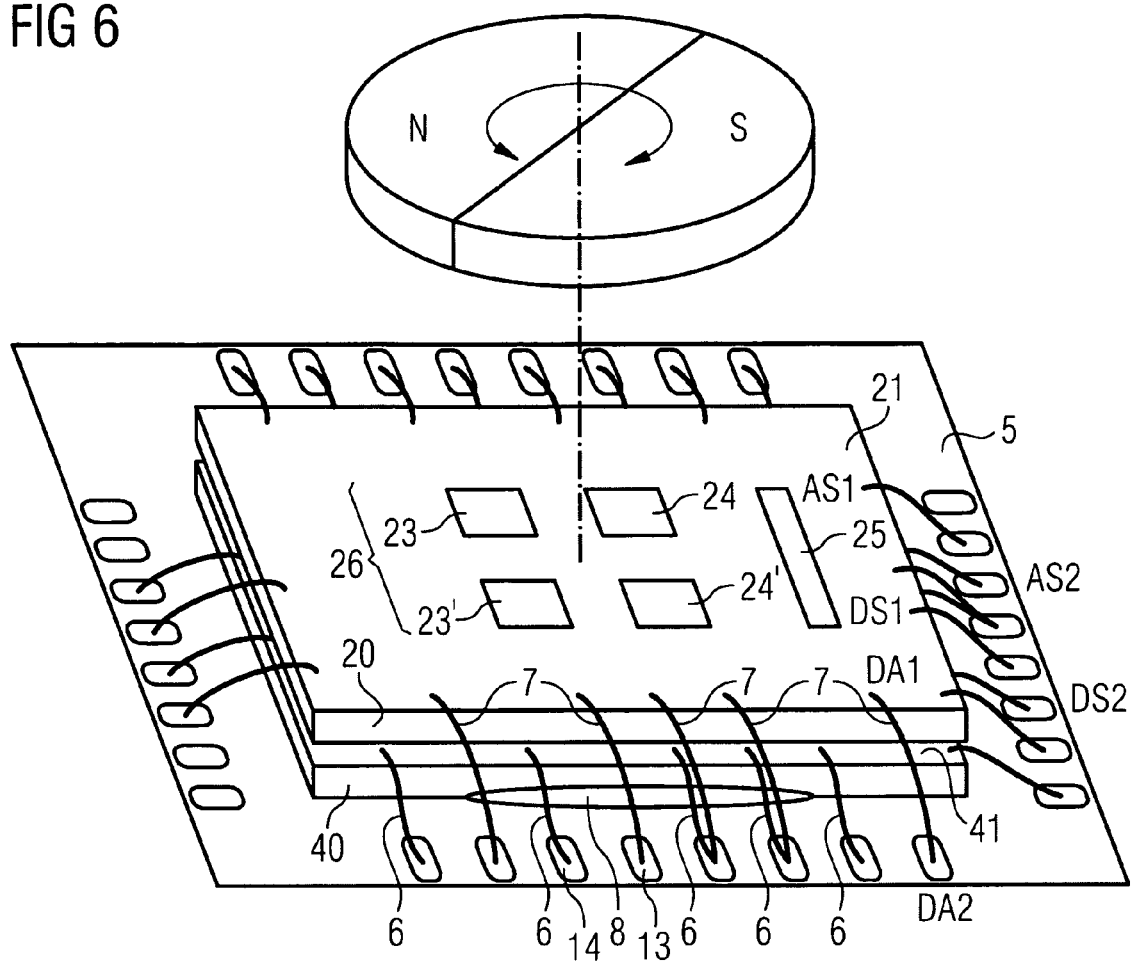
FIG. 6 shows a three-dimensional view of an exemplary magnetic field sensor arrangement.

FIG. 6 shows in a three-dimensional view, as an exemplary further development of the cross section in FIG. 1, the first and the second magnetic field sensor bodies 20, 40 which are both built as approximately equal sized bodies. The two magnetic field sensor bodies 20, 40 are built rectangular in shape and are distanced from each other by means of a spacer 3, which is covered by the first magnetic field sensor body 20.

Bonding wires 6 connect the second magnetic field sensor body 40 to connectors on the carrier body 5. Correspondingly, bonding wires 7 connect the first magnetic field sensor body 20 to connectors on the carrier body 5. A connecting layer 8 is located not only between the carrier body 5 and the second magnetic field sensor body 40, but covers a part of the chip edge of the second magnetic field sensor body 40. The connecting layer 8 in this exemplary magnetic field sensor arrangement is built as a silver conductive adhesive.

Thus, both magnetic field sensor bodies 20, 40 in this view have their respective first main surfaces 21, 41 turned towards the viewer.

Advantageously, the first magnetic field sensor body 20 as well as, due to the spacer 3, the second magnetic field sensor body 40 with bonding wires 6, 7 on their respective first main sides 21, 41 are electrically conductively connected to connectors on the carrier body 5.

Figure 7:
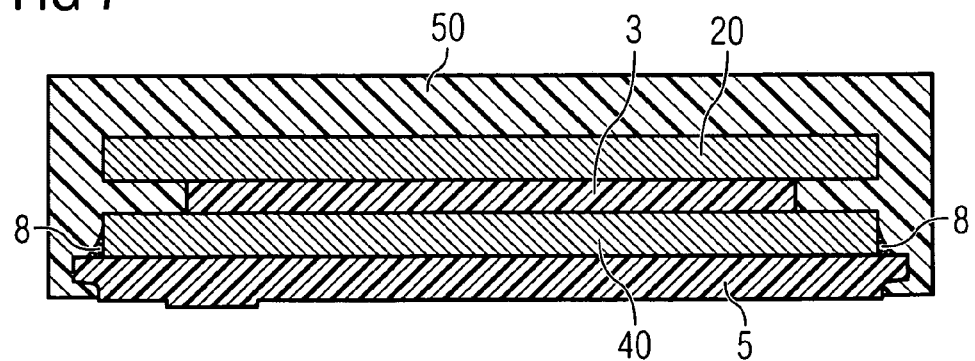
FIG. 7 shows contour lines, which were extracted from a photograph of a transverse section from an actual device, which shows a cross section of an exemplary magnetic field sensor arrangement.

FIG. 7 shows contour lines, which were extracted from a photograph of a transverse section, from an actual device, which shows a cross section of an exemplary magnetic field sensor arrangement. FIG. 7 shows the first magnetic field sensor body 20, which is affixed on the spacer 3. The spacer 3 is, in turn, affixed on the second magnetic field sensor body 40. The second magnetic field sensor 40 is, in turn, arranged on the carrier body 5. Material of the connecting layer 8, which is located between the two bodies 5, 40, can be seen in the angles between the second magnetic field sensor body 40 and the carrier body 5.

In this exemplary magnetic field sensor arrangement, a smaller value is selected for the thickness of the spacer 3 than for the thickness of the first and of the second magnetic field sensor bodies 20, 40, wherein the latter can amount to, for example, 250 µm.

The first and the second magnetic field sensor bodies 20, 40, as well as the spacer 3, are realized from silicon. The lateral dimension of the spacer 3, shown in the cross section, is smaller than the lateral dimension of the first and of the second magnetic field sensor bodies 20, 40.

The magnetic field sensor arrangement is housed in a quad flatpack no-lead logic package 11, which has a polymer that encloses the first magnetic field sensor body 20, the spacer 3 and the second magnetic field sensor body 40, see also FIG. 1.

Thus advantageously, the two magnetic field sensor bodies 20, 40 are enclosed very well and protected from mechanical loading. Advantageously, the spacer 3 has the same material, namely silicon, as the two magnetic field sensor bodies 20, 40, such that it has the same temperature coefficient for expansion. Thus, the spacer does not cause any mechanical stress in the two magnetic field sensor bodies 20, 40 during temperature changes. Advantageously, the lateral dimension of the spacer 3 that is smaller in comparison with the two magnetic field sensor bodies 20, 40, makes it possible that the second magnetic field sensor body 40 can also be connected to the bonding wires.

The invention is not restricted to the description with the aid of the exemplary embodiments. Rather, the invention comprises each new feature and each combination of features, which includes, in particular, each combination of features in the patent claims, even when this feature or this combination is not itself explicitly specified in the patent claims or exemplary embodiments.

The invention claimed is:

1. A magnetic field sensor arrangement, comprising a stacked arrangement with
    a first magnetic field sensor body with a first main surface, on which is arranged a first magnetic field sensitive element, a second main surface, which is approximately parallel to the first main surface, and a first magnetic field evaluation circuit, on the output side of which a first magnetic field sensitive signal is accessible, and which is arranged on the first main surface of the first magnetic sensor body; and
    a second magnetic field sensor body with a first main surface, on which is arranged a second magnetic field sensitive element, a second main surface, which is approximately parallel to the first main surface, and a second magnetic field evaluation circuit, on the output side of which a second magnetic field sensitive signal can be accessed, and which is arranged on the first main surface of the second magnetic field sensor body,
    wherein the stacked arrangement is realized such that the first magnetic field sensor body and the second magnetic field sensor body are arranged above one another in a projection direction that is perpendicular to the respective first main surface of the first and of the second magnetic field sensor body.

2. The magnetic field sensor arrangement according to claim 1, wherein
    at least one magnetic field sensitive element from the group of the first and the second magnetic field sensitive elements is built as a Hall structure.

3. Magnetic field sensor arrangement according to claim 1, wherein
    at least one magnetic field sensitive element from the group of the first and the second magnetic field sensitive elements is built as a structure from the group of a giant magneto-resistive structure and an anisotropic magnetic resistor structure.

4. The magnetic field sensor arrangement according to claim 1, wherein
the first magnetic field sensor body has a first magnetic sensor array, which comprises the first magnetic field sensitive element and at least a further magnetic field sensitive element, or the second magnetic field sensor body has a second magnetic sensor array, which comprises the second magnetic field sensitive element and at least one further magnetic field sensitive element.

5. The magnetic field sensor arrangement according to claims 1, wherein
a main surface from the group of the first and the second main surfaces of the first magnetic field sensor body is facing towards a main surface from the group of the first and the second main surface of the second magnetic field sensor body.

6. The magnetic field sensor arrangement according to claim 1, wherein
the stacked arrangement comprises a spacer, which is arranged between the first magnetic field sensor body and the second magnetic field sensor body.

7. The magnetic field sensor arrangement according to claim 6, wherein
the spacer comprises a semiconductor body, which is produced from a thinned wafer of a semiconductor material.

8. The magnetic field sensor arrangement according to claim 1, wherein
at least one magnetic field sensor body from the group of the first magnetic field sensor body and the second magnetic field sensor body has a semiconductor body, which is produced from a thinned wafer of a semiconductor material.

9. The magnetic field sensor arrangement according to claim 1, wherein
the stacked arrangement comprises a carrier body, which is arranged between the first magnetic field sensor body and the second magnetic field sensor body.

10. The magnetic field sensor arrangement according to claim 1, wherein
the stacked arrangement comprises a carrier body, which is arranged on a main surface from the group of main surfaces of the second magnetic field sensor body, which is distanced further from the first magnetic field sensor body, and the main surface of the first magnetic field sensor body, which is distanced further from the second magnetic field sensor body.

11. The magnetic field sensor arrangement according to claim 1, wherein
at least one magnetic field sensor body from the group of the first magnetic field sensor body and the second magnetic field sensor body comprises a conducting connection from the first to the second main surface through the first or the second magnetic field sensor body respectively.

12. The magnetic field sensor arrangement according to claim 1, wherein
on the output side of first magnetic field evaluation circuit, at least one first magnetic field sensitive signal, from the group of a first digital signal and a first analog signal, can be accessed, and
on the output side of second magnetic field evaluation circuit, at least one second magnetic field sensitive signal, from the group of a second digital signal and a second analog signal, can be accessed.

13. The magnetic field sensor arrangement according to claim 12, wherein
the first magnetic field evaluation circuit is designed to output a first diagnostic signal that is dependent on the operational state, or the second magnetic field evaluation circuit is designed to output a second diagnostic signal that is dependent on the operational state.

14. The magnetic field sensor arrangement according to claim 12, wherein
the magnetic field sensor arrangement comprises a further semiconductor body with a connecting circuit, which is coupled on the input side to at least one output of the first magnetic field evaluation circuit of the first magnetic field sensor body and to at least one output of the second magnetic field evaluation circuit of the second magnetic field sensor body.

15. The magnetic field sensor arrangement according to claim 1, wherein
the first main surface of the first magnetic field sensor body and the first main surface of the second magnetic field sensor body have approximately equal geometric dimensions.

16. The magnetic field sensor arrangement according to claim 1, wherein
the first main surface of the first magnetic field sensor body and the first main surface of the second magnet field sensor body are of different sizes.

17. The magnetic field sensor arrangement according to claim 1, wherein
the magnetic field sensor arrangement is housed in a quad flatpack no-lead logic package.

18. A method for non-contact measurement of a magnetic field by means of two stacked magnetic field sensor bodies comprising the steps of:
determining the magnetic field by means of a first magnetic field sensor body and outputting a first magnetic field dependent signal by means of a first magnetic field evaluation circuit of the first magnetic field sensor body such that a first magnetic field sensitive element and the first magnetic field evaluation circuit are arranged on a first main surface of the first magnetic field sensor body, and
determining the magnetic field by means of a second magnetic field sensor body and outputting a second magnetic field dependent signal by means of a second magnetic field evaluation circuit of the second magnetic field sensor body, wherein a second magnetic field sensitive element and the second magnetic field evaluation circuit are arranged on a first main surface of the second magnetic field sensor body,
wherein the first and the second magnetic field sensor bodies are stacked such that the first magnetic field sensor body and the second magnetic field sensor body are arranged above one another in a projection direction that is perpendicular to the first surfaces of both the first and the second magnetic field sensor bodies.

19. The method according to claim 18, comprising:
outputting at least a first magnetic field dependent signal from a group of a first digital signal and a first analog signal, and
outputting at least a second magnetic field dependent signal from a group of a second digital signal and a second analog signal.

20. The method according to claim 19, comprising feeding the first magnetic field dependent signal and the second magnetic field dependent signal to a connecting circuit and providing angle information on the output side of the connecting circuit.

21. The method according to claim 19, comprising feeding the first and the second digital signal and the first and the second analog signal to the connecting circuit, comparing the four signals by means of the connecting circuit and providing the angle information from three of the four signals.

22. The method according to claim 18, comprising:
outputting a first diagnostic signal that is dependent on the operational state by the first magnetic field evaluation circuit and outputting a second diagnostic signal that is dependent on the operational state by the second magnetic field evaluation circuit.

23. The method according to claim 22, comprising providing the angle information based on the first and the second signals that are dependent on the operational state.

* * * * *

UNITED STATES PATENT AND TRADEMARK OFFICE
CERTIFICATE OF CORRECTION

PATENT NO. : 7,906,961 B2  
APPLICATION NO. : 12/086831  
DATED : March 15, 2011  
INVENTOR(S) : Sari Abwa et al.

Page 1 of 1

It is certified that error appears in the above-identified patent and that said Letters Patent is hereby corrected as shown below:

Title Page

(73) ~~austrianmicrosystems AG, Unterpremastätten (AT)~~

Should read austriamicrosystems AG, Unterpremstätten (AT)

Title Page

(56) References Cited

FOREIGN PATENT DOCUMENTS

~~DE 102004017119 A1 10/2005~~

Should read

DE 102004017191 A1 10/2005

Signed and Sealed this  
First Day of October, 2013

Teresa Stanek Rea  
*Deputy Director of the United States Patent and Trademark Office*